US009082903B2

(12) United States Patent
Shao et al.

(10) Patent No.: US 9,082,903 B2
(45) Date of Patent: Jul. 14, 2015

(54) PHOTOVOLTAIC DEVICE WITH A ZINC MAGNESIUM OXIDE WINDOW LAYER

(75) Inventors: Rui Shao, Sylvania, OH (US); Markus Gloeckler, Perrysburg, OH (US)

(73) Assignee: FIRST SOLAR, INC., Perrysburg, OH (US)

( * ) Notice: Subject to any disclaimer, the term of this patent is extended or adjusted under 35 U.S.C. 154(b) by 209 days.

(21) Appl. No.: 13/238,457

(22) Filed: Sep. 21, 2011

(65) Prior Publication Data

US 2012/0067421 A1    Mar. 22, 2012

Related U.S. Application Data

(60) Provisional application No. 61/385,399, filed on Sep. 22, 2010.

(51) Int. Cl.
| | | |
|---|---|---|
| H01L 31/00 | (2006.01) | |
| H01L 31/0224 | (2006.01) | |
| H01L 31/073 | (2012.01) | |
| H01L 31/18 | (2006.01) | |

(52) U.S. Cl.
CPC ...... *H01L 31/022466* (2013.01); *H01L 31/073* (2013.01); *H01L 31/1828* (2013.01); *Y02E 10/543* (2013.01)

(58) Field of Classification Search
CPC ............ H01L 31/022466; H01L 31/1828; H01L 31/073; Y02E 10/543
USPC ................. 136/252, 260, 264, 265
See application file for complete search history.

(56) References Cited

U.S. PATENT DOCUMENTS

| 4,160,678 | A * | 7/1979 | Jain et al. ............... | 136/255 |
|---|---|---|---|---|
| 6,259,016 | B1 * | 7/2001 | Negami et al. ............ | 136/265 |
| 2004/0182434 | A1 * | 9/2004 | Hashimoto et al. ......... | 136/256 |
| 2008/0115827 | A1 * | 5/2008 | Woods et al. ............ | 136/255 |
| 2009/0020149 | A1 * | 1/2009 | Woods et al. ............ | 136/244 |
| 2009/0084438 | A1 * | 4/2009 | den Boer et al. .......... | 136/256 |

(Continued)

FOREIGN PATENT DOCUMENTS

| CN | 1531114 | 9/2004 |
|---|---|---|
| DE | 10 2007 047 146 A1 | 4/2008 |

OTHER PUBLICATIONS

English Machine translation of DE102007047146A1.*

(Continued)

*Primary Examiner* — Jonathan Johnson
*Assistant Examiner* — Lindsey Bernier
(74) *Attorney, Agent, or Firm* — Dickstein Shapiro LLP (57) ABSTRACT

Methods and devices are described for a photovoltaic device and substrate structure. In one embodiment, a photovoltaic device includes a substrate structure and a CdTe absorber layer, the substrate structure including a $Zn_{1-x}Mg_xO$ window layer and a low conductivity buffer layer. Another embodiment is directed to a process for manufacturing a photovoltaic device including forming a $Zn_{1-x}Mg_xO$ window layer over a substrate by at least one of sputtering, evaporation deposition, CVD, chemical bath deposition process and vapor transport deposition process. The process including forming a CdTe absorber layer above the $Zn_{1-x}Mg_xO$ window layer.

9 Claims, 7 Drawing Sheets

(56) References Cited

U.S. PATENT DOCUMENTS

2011/0005591 A1     1/2011    Buller et al.
2011/0005594 A1     1/2011    Powell et al.

OTHER PUBLICATIONS

A. Morales-Acevedo, "Thin Film CdS/CdTe Solar Cells: Research Perspectives," Solar Energy, vol. 80, pp. 675-681, (2006).

N, Naghavi et al., "Buffer Layers and Transparent Conducting Oxides for Chalcopyrite $Cu(In,Ga)(S,Se)_2$ Based Thin Film Photovoltaics: Present Status and Current Developments," Progress in Photovoltaics: Research and Applications, vol. 18, pp. 411-433, 2010.

J. Sites et al., "Strategies to Increase CdTe Solar-Cell Voltage," Thin Solid Films, vol. 515, pp. 6099-6102, 2007.

J. Perrenoud et al., "Application of $ZnO_{1-x}S_x$ as Window Layer in Cadmium Telluride Solar Cells," 2010 35$^{th}$ IEEE Photovoltaic Specialists Conference, pp. 000995-001000, Jun. 1, 2010. ISBN: 978-1-4244-5892-9/10.

Takashi Minemoto, "$Cu(In,Ga)Se_2$ solar cells with controlled conduction band offset of window/$Cu(In,Ga)Se_2$ layers", Journal of Applied Physics, Jun. 15, 2001, pp. 8327-8330, vol. 89, No. 12.

Takashi Minemoto et al., "Control of conduction band ofset in widegap $Cu(In,Ga)Se_2$ solar cells", Solar Enerygy Materials & Solar Cells, 2003, pp. 121-126, vol. 75.

M. Gloeckler, et al., "Efficiency limitations for wide-band-gap chalcopyrite solar cells", Thin Solid Films 480-481 (205) p. 241-245.

\* cited by examiner

*FIG. 1*
*-BACKGROUND-*

*FIG. 2*
*-BACKGROUND-*

PHOTOVOLTAIC DEVICE WITH A ZINC MAGNESIUM OXIDE WINDOW LAYER

CROSS REFERENCE TO RELATED APPLICATION

This application claims priority under 35 U.S.C. §119(e) to Provisional Application No. 61/385,399 filed on Sep. 22, 2010, which is hereby incorporated by reference in its entirety.

FIELD OF THE INVENTION

Embodiments of the invention relate to semiconductor devices and methods of manufacture, and more particularly to the field of photovoltaic (PV) devices.

BACKGROUND OF THE INVENTION

Figure 1:
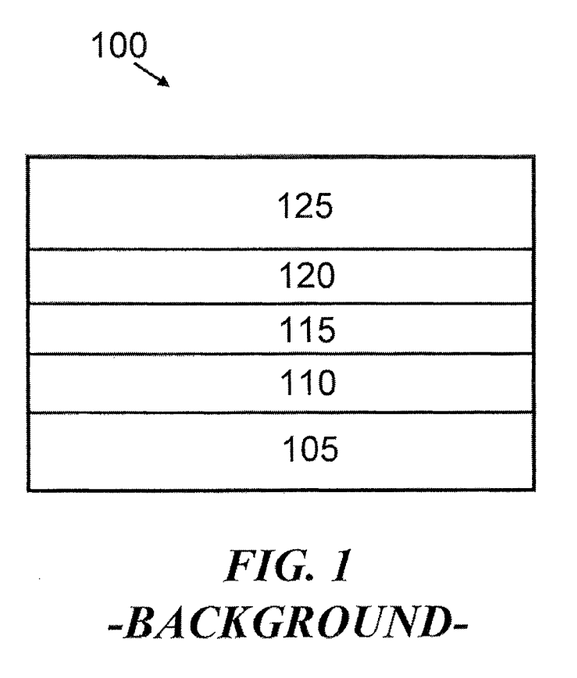
FIG. 1 depicts a typical photovoltaic device.

Photovoltaic devices generally comprise multiple layers of material deposited on a substrate, such as glass. FIG. 1 depicts a typical photovoltaic device. Photovoltaic device 100 may employ a glass substrate 105, a transparent conductive oxide (TCO) layer 110 deposited on substrate 105, a window layer 115 made from an n-type semiconductor material, an absorber layer 120 made from a semiconductor material, and a metal back contact 125. Typical devices use cadmium telluride (CdTe) as absorber layer 120 and include glass substrate 105, tin oxide ($SnO_2$) or cadmium tin oxide ($Cd_2SnO_4$) as TCO layer 110, and cadmium sulfide (CdS) as the window layer 115. By way of example, a deposition process for a typical photovoltaic device on substrate 105 may be ordered as TCO layer 110 including a n-type material doped with one of $SnO_2$ and $Cd_2SnO_4$, CdS window layer 115, a CdTe absorber layer 120, and metal back contact 125. CdTe absorber layer 120 may be deposited on top of window layer 115.

Figure 2:
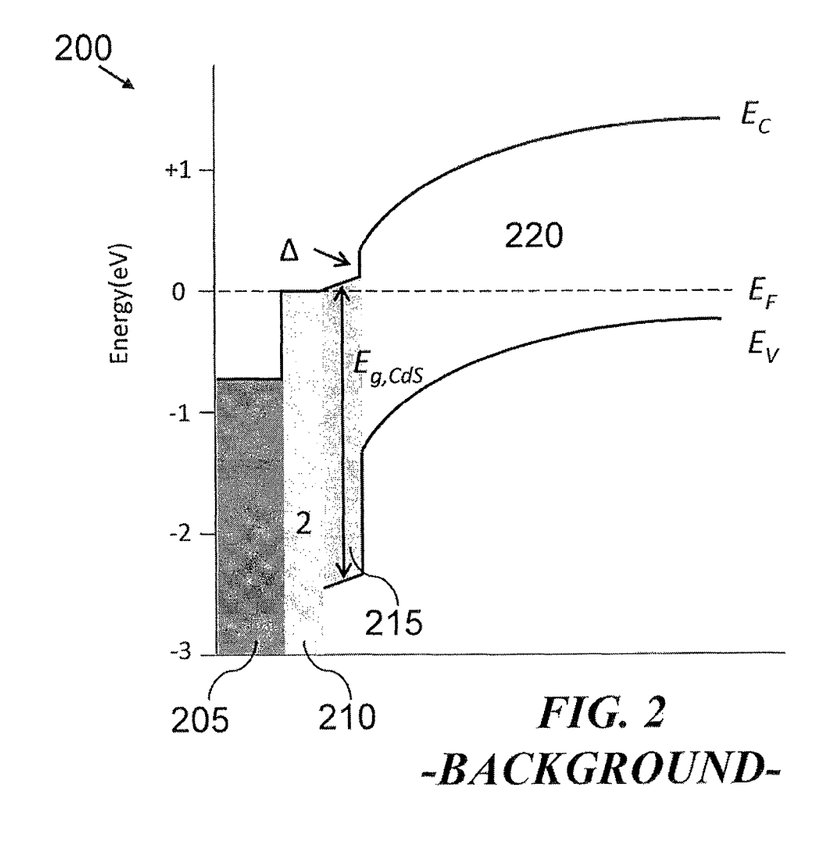
FIG. 2 depicts an exemplary energy band diagram of a typical thin-film photovoltaic device.

An exemplary energy band diagram of a typical thin-film photovoltaic device, such as a CdTe device is depicted in FIG. 2. Band gap energy for F-doped $SnO_2$ as TCO layer is depicted as 205, band gap energy of undoped $SnO_2$ as a buffer layer is depicted as 210, band gap energy of CdS as the window layer is depicted as 215, and band gap energy of CdTe as an absorber layer is depicted as 220. Typically, the conduction band edge offset of CdS relative to CdTe, Δ, is usually −0.2 eV with an experimental uncertainty of +/−0.1 eV.

As depicted in FIG. 2, Δ is the offset in the conduction band edge Ec between the window layer and absorber. In the case of a CdS/CdTe stack, Δ is about −0.2 eV. Theoretical modeling has shown that a more negative Δ leads to larger loss in Voc and FF due to increased rate at which photo carriers recombine at the window/absorber interface. When Δ is made slightly positive (0 to 0.4 eV), the recombination rate can be minimized, leading to improved Voc and FF.

CdS is the conventional window layer in many types of thin-film photovoltaic devices, including photovoltaic devices employing one of CdTe and Cu(In, Ga)Se$_2$ as an absorber layer. However, as depicted in FIG. 2, the optical band gap for CdS is only 2.4 eV.

DETAILED DESCRIPTION OF THE INVENTION

Figure 3A:
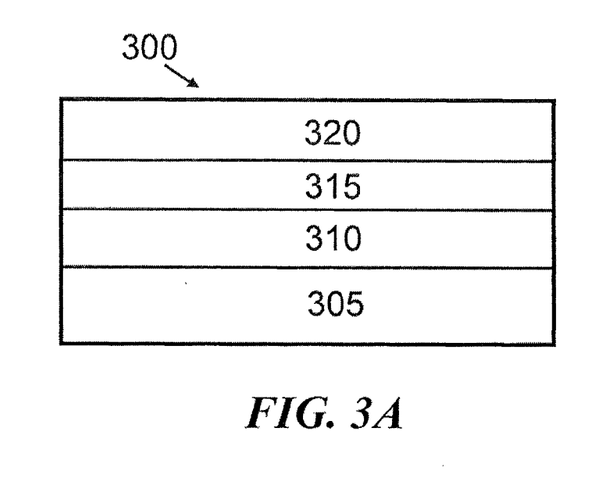
FIG. 3A depicts a substrate structure according to one embodiment.

This disclosure is directed to photovoltaic devices and methods of production. In one embodiment, $Zn_{1-x}Mg_xO$ is employed for a window layer of substrate structure. FIG. 3 depicts substrate structure 300 according to one embodiment. Substrate structure 300 includes substrate 305, transparent conductive oxide (TCO) layer 310, buffer layer 315 and window layer 320. TCO layer 310 may typically be employed to allow solar radiation to enter a photovoltaic device and may further act as an electrode. TCO layer 310 may include an n-type material doped with one of $SnO_2$ and $Cd_2SnO_4$. Window layer 320 may be employed to mitigate the internal loss of photo carriers (e.g., electrons and holes) in the device and may strongly influence device parameters including open circuit voltage (Voc), short circuit current (Isc) and fill factor (FF). In one embodiment, window layer 320 may allow incident light to pass to an absorber material to absorb light. According to one embodiment, to improve overall photo emission efficiency of window layer 320, window layer 320 comprises a $Zn_{1-x}Mg_xO$ compound.

In one embodiment, substrate structure 300 may include a glass substrate 305, and TCO layer 310. Buffer layer 315 may be optional. Window layer 320 (e.g., $Zn_{1-x}Mg_xO$ layer) may be directly on top of TCO layer 310, the TCO layer including one or more of a F-doped $SnO_2$, undoped $SnO_2$, and $Cd_2SnO_4$. When TCO layer 310 includes an undoped $Cd_2SnO_4$, the TCO layer has no extrinsic dopant, however the layer may be highly n-type due to oxygen vacancies.

Figure 4:
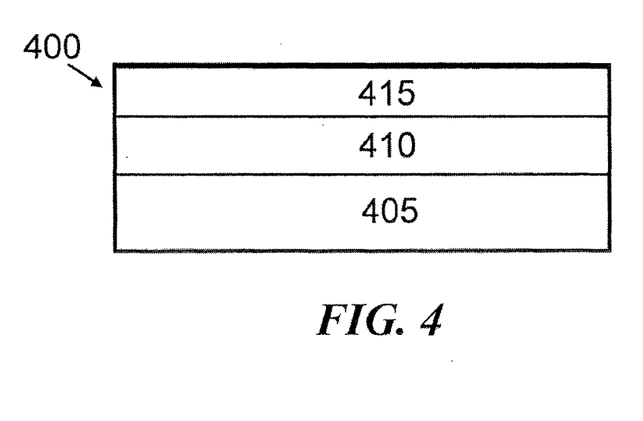
FIG. 4 depicts a substrate structure according to another embodiment.

According to another embodiment, substrate structure 300 may be provided for manufacturing photovoltaic devices. As depicted in FIG. 3A, the substrate structure includes substrate 305, TCO layer 310, low conductivity buffer layer 315, and $Zn_{1-x}Mg_xO$ window layer 320. The substrate structure of FIG. 3A includes $Zn_{1-x}Mg_xO$ window layer 320 onto which other layers of a device can be deposited (e.g., absorber layer, metal back, etc.). In one embodiment, $Zn_{1-x}Mg_xO$ window layer 320 may be deposited onto a F—$SnO_2$ based substrate structure (like TEC10). Similarly, substrate structure 300 can be a cadmium stannate (CdSt) substrate structure. Buffer layer 315 may be used to decrease the likelihood of irregularities occurring during the formation of the semiconductor window layer. Buffer layer 315 may be made from a material less conductive than TCO layer 310, such as undoped tin oxide, zinc tin oxide, cadmium zinc oxide or other transparent conductive oxide or a combination thereof In certain embodiments, substrate structure 300 may not include a buffer layer as depicted in FIG. 4. When substrate structure 300 includes a low conductivity buffer layer 315, the buffer layer is arranged between the substrate 305 (e.g., glass) and the $Zn_{1-x}Mg_xO$ window layer.

In one embodiment the thickness of $Zn_{1-x}Mg_xO$ window layer 320 ranges from 2 to 2000 nm. In another embodiment, the composition of x in $Zn_{1-x}Mg_xO$ is greater than 0 and less than 1. Window layer 320 may be a more conductive material relative to conventional window layer materials, such as CdS. Additionally, window layer 320 may include a window layer material that allows for greatly reduced fill factor (FF) loss in a blue light deficient environment. A $Zn_{1-x}Mg_xO$ window layer may allow for more solar radiation in the blue region (e.g., 400 to 475 nm) that can reach the absorber leading to higher short circuit current (Isc).

Figure 3B:
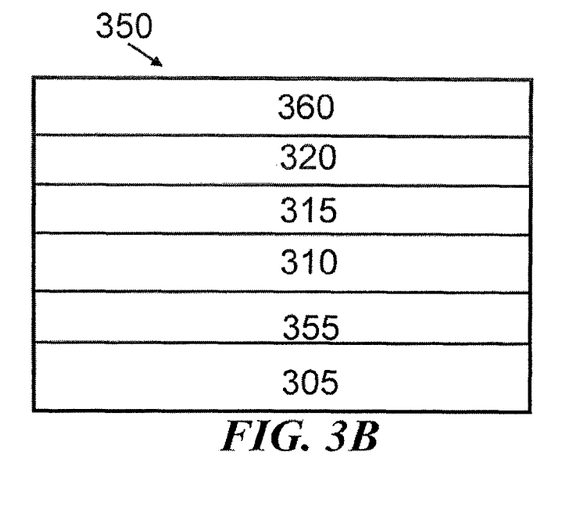
FIG. 3B depicts a substrate structure according to another embodiment.

In an alternative embodiment, a photovoltaic device, such as substrate structure 300 may include a $Zn_{1-x}Mg_xO$ compound material as window layer 320 and one or more of a barrier layer and a CdS window layer, as depicted in FIG. 3B. Barrier layer 355 of substrate structure 350 can be silicon oxide, silicon aluminum oxide, tin oxide, or other suitable material or a combination thereof CdS window layer 360 may be deposited on $Zn_{1-x}Mg_xO$ layer 320, wherein the CdS window relates to a surface for depositing an absorber layer. In one embodiment, a photovoltaic device includes a $Zn_{1-x}Mg_xO$ window layer, in addition to a substrate structure (e.g., substrate structure 300). For example, substrate structure 300 may utilize a TCO stack including a substrate 305, TCO layer 310 and one or more additional elements. In another embodiment, substrate structure 300 may include buffer layer 315.

$Zn_{1-x}Mg_xO$ may be advantageous over a conventional CdS window layers as $Zn_{1-x}Mg_xO$ has a wider band gap relative to a device having a CdS window layer. As such, more solar radiation can reach a CdTe absorber, which leads to higher Isc. Similarly, an improved conduction band edge alignment can be achieved by adjusting composition of $Zn_{1-x}Mg_xO$, which leads to higher Voc. The dopant concentration can be in the range of $10^{15}$ to $10^{19}$ atoms (or ions) of dopant per $cm^3$ of metal oxide. Carrier density of $Zn_{1-x}Mg_xO$ can be greater than the carrier density of CdS. As such, a stronger n-p semiconductor heterojunction can be formed increasing the built-in potential of the solar cells and minimizing recombination at the interface. A more conductive window layer can also improve the loss in fill factor in a low light environment (e.g., photoconductivity effect), where the percentage of blue light is reduced greatly as compared to under full sun light.

Figure 5A:
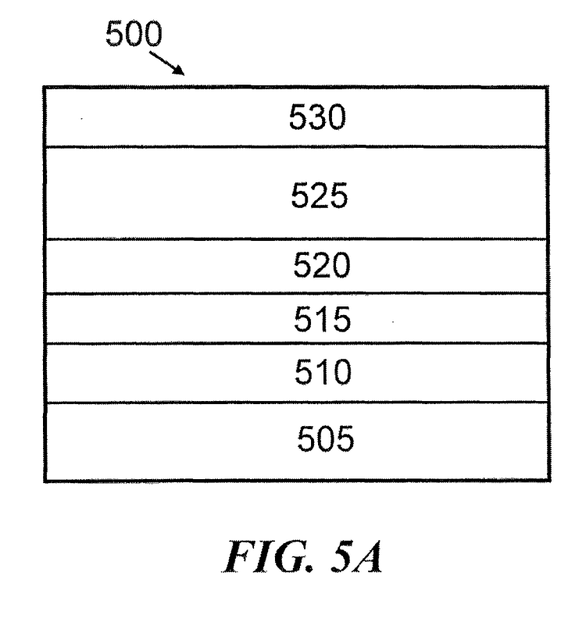
FIG. 5A depicts a thin-film photovoltaic device according to one embodiment.
Figure 5B:
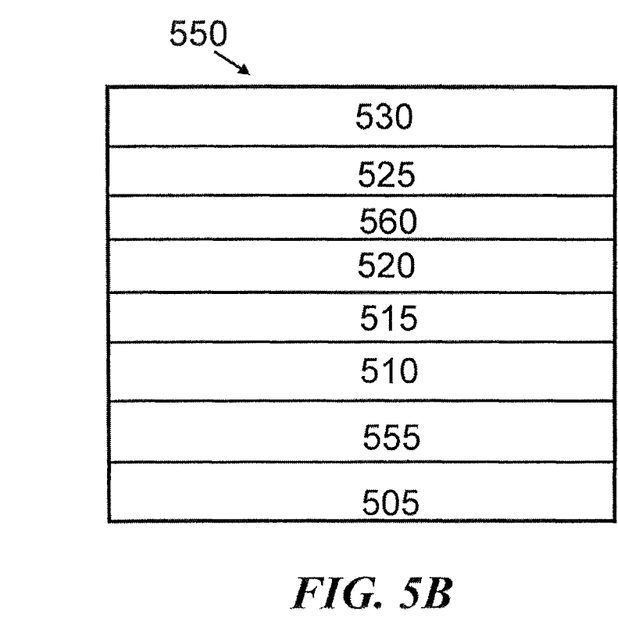
FIG. 5B depicts a thin-film photovoltaic device according to another embodiment.

Referring to FIG. 4, the substrate structure of FIG. 3A is depicted according to another embodiment. Substrate structure 400 includes substrate 405, TCO layer 410, and $Zn_{1-x}Mg_xO$ window layer 420. Substrate structure 400 may be manufactured at lower cost in comparison to the substrate structure of FIG. 3A According to another embodiment, $Zn_{1-x}Mg_xO$ may be employed for a window layer of a photovoltaic device. FIGS. 5A-5B depict photovoltaic devices according to one or more embodiments, which may be formed as thin-film photovoltaic devices. Referring first to FIG. 5A, photovoltaic device 500 includes substrate 505, transparent conductive oxide (TCO) layer 510, buffer layer 515, window layer 520, absorber layer 525, and metal back contact 530. Absorber layer 525 may be employed to generate photo carriers upon absorption of solar radiation. Metal back contact 530 may be employed to act as an electrode. Metal back contact 530 may be made of molybdenum, aluminum, copper, or any other high conductive materials. Window layer 520 of photovoltaic device 500 may include a $Zn_{1-x}Mg_xO$ compound.

More specifically, photovoltaic device 500 may include one or more of glass substrate 505, TCO layer 510 made from $SnO_2$ or $Cd_2SnO_4$, buffer layer 515, a $Zn_{1-x}Mg_xO$ window layer 520, a CdTe absorber 525, and a metal back contact 530. Buffer layer 515 may relate to a low conductivity buffer layer, such as undoped $SnO_2$. Buffer layer 515 may be used to decrease the likelihood of irregularities occurring during the formation of the semiconductor window layer. Absorber layer 525 may be a CdTe layer. The layer thickness and materials are not limited by the thicknesses depicted in FIGS. 5A-5B. In one embodiment, the device of FIG. 5A may employ the substrate of FIG. 3A. In certain embodiments, photovoltaic device 500 may or may not include a low conductivity buffer layer 515, absorber layer 520 a metal back contact 530.

Photovoltaic device 500 may include one or more of a cadmium telluride (CdTe), copper indium gallium (di)selenide (CIGS), and amorphous silicon (Si) as the absorber layer 525. In one embodiment, a photovoltaic device may be provided that includes a $Zn_{1-x}Mg_xO$ window layer 520 between a substrate structure, which may or may not include a low conductivity buffer layer 515, and the absorber layer 525. In certain embodiments, the device may additionally include a CdS window layer in addition to $Zn_{1-x}Mg_xO$ window layer 520.

In an alternative embodiment, photovoltaic device 500 may include a $Zn_{1-x}Mg_xO$ compound material as window layer 520 and one or more of a barrier layer and a CdS window layer as depicted in FIG. 5B. Barrier layer 555 can be silicon oxide, silicon aluminum oxide, tin oxide, or other suitable material or a combination thereof. CdS window layer 560 may be deposited on $MS_{1-x}O_x$ layer 520, wherein CdS window layer 560 provides a surface for depositing an absorber layer.

Figure 6:
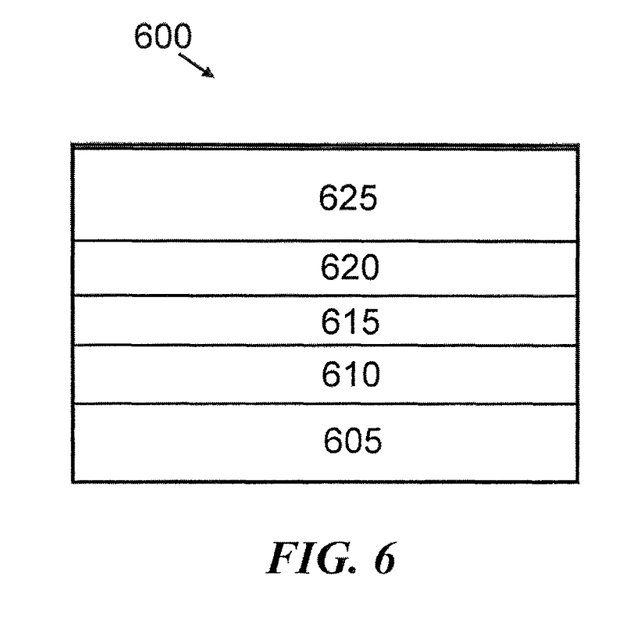
FIG. 6 depicts a thin-film photovoltaic device according to another embodiment.

In certain embodiments, photovoltaic device 500 may not include a buffer layer. FIG. 6 depicts thin-film photovoltaic device 600 which includes glass substrate 605, TCO layer 610 made from $SnO_2$ or $Cd_2SnO_4$, a $MS_{1-x}O_x$ window layer 615, a CdTe absorber 620, and a metal back contact 625

Figure 7:
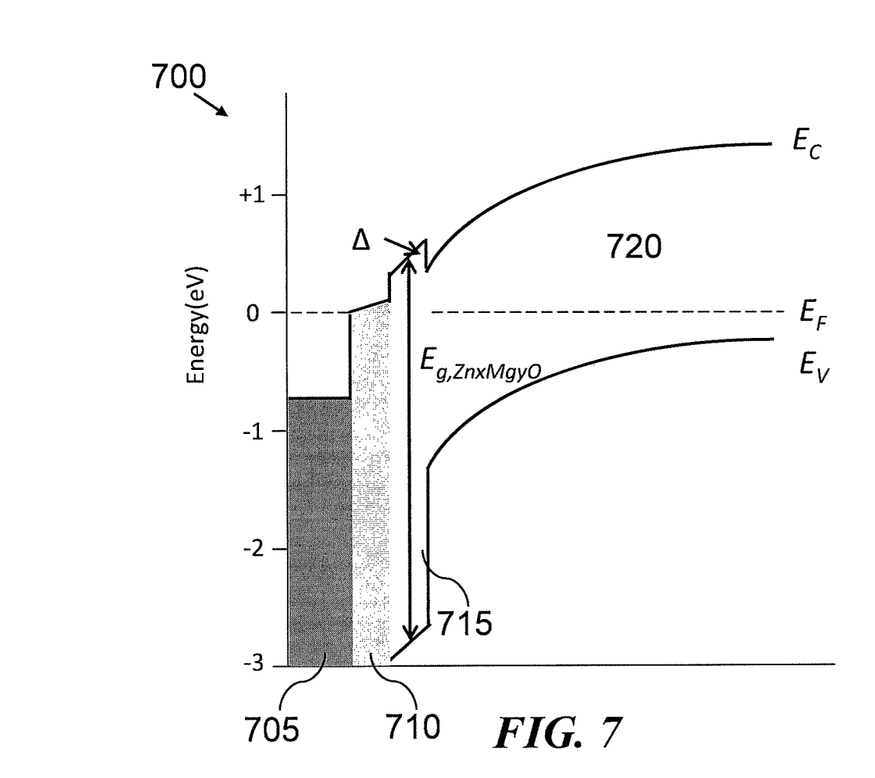
FIG. 7 depicts an energy band diagram of a thin-film photovoltaic device according to one embodiment.

FIG. 7 depicts the band structure of a photovoltaic device, such as a photovoltaic device that employs a CdTe absorber layer, according to one embodiment. In FIG. 7, Band gap energy depicted for F-doped $SnO_2$ as a TCO layer is depicted as 705, undoped $SnO_2$ as a buffer layer is depicted as 710, $Zn_{1-x}Mg_xO$ as the window layer depicted as 715, and CdTe as the absorber layer is depicted as 720. As further depicted, the conduction band edge offset of $Zn_{1-x}Mg_xO$ relative to CdTe, Δ, can be adjusted to 0-0.4 eV. Another advantage of the photovoltaic device of FIG. 3 may be a wider band gap in comparison to CdS.

Both zinc oxide (ZnO) and magnesium oxide (MgO) are wide band gap oxides. ZnO has a band gap of 3.2 eV and MgO has a band gap of about 7.7 eV. ZnO may further be advantageous as it is highly dopable. The ternary compound $Zn_{1-x}Mg_xO$ should have a band gap of at least 3 eV as predicted by simulation, which is much larger than that of CdS, and is thus more transparent to blue light. On the other hand, ZnO has a Δ from −0.6 to −1.0 eV relative to CdTe conduction band edge, while MgO has a positive Δ about 2.7 eV. Therefore, the composition of the ternary compound $Zn_{1-x}Mg_xO$ can be tuned to lead to a Δ that is slightly positive, as shown in FIG. 4.

Figure 8A:
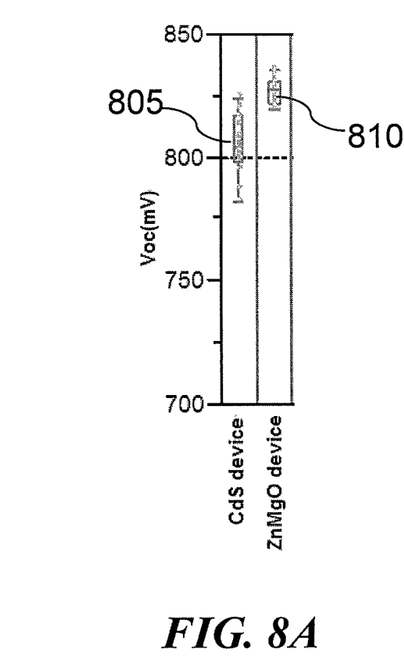
FIG. 8A depicts a graphical representation of open circuit voltage according to one embodiment.
Figure 8B:
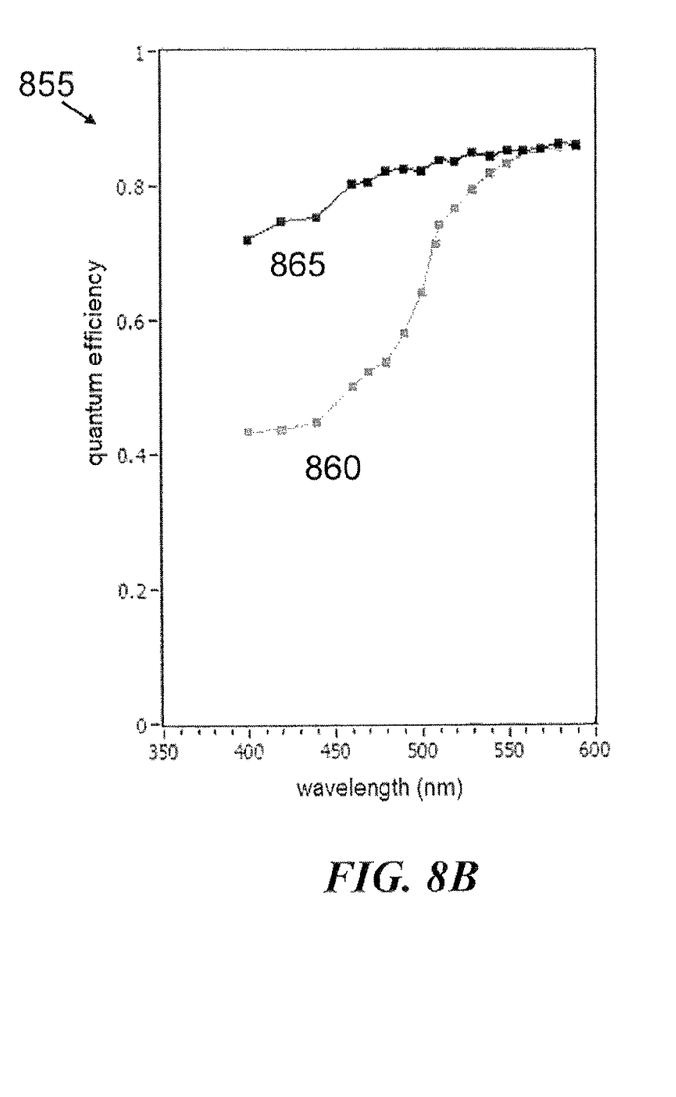
FIG. 8B depicts a graphical representation of quantum efficiency according to another embodiment.

FIGS. 8A-8B depict advantages that may be provided by employing $Zn_{1-x}Mg_xO$ in the window layer of a photovoltaic device. Referring first to FIG. 8A, a graphical representation is shown of open circuit voltage for a CdS device 805 and $Zn_{1-x}Mg_xO$ device 810.

The improvement in device Voc by replacing a CdS window layer with a $Zn_{1-x}Mg_xO$ window layer may include improved open circuit voltage from 810 mV to 826 mV. FIG.

8B depicts a graphical representation of quantum efficiency 855 in the range of 400 to 600 nm. As depicted in FIG. 8B, a CdTe device with $Zn_{1-x}Mg_xO$ window layer, depicted as 865, has a higher quantum efficiency relative to a CdS window layer, depicted as 860, from 400-500 nm. The current density of $Zn_{1-x}Mg_xO$ may relate to 22.6 mA/cm$^2$ relative to 21.8 mA/cm$^2$ for CdS. The values of Voc improvements described herein are exemplary, as it may be difficult to measure a certain improvement delta. Source current may improve up to 2 mA/cm$^2$, wherein the improvement compared to a CdS devices may depend on the thickness of CdS employed.

In another aspect, a process is provided for manufacturing photovoltaic devices and substrates to include a $Zn_{1-x}Mg_xO$ window layer as depicted in FIGS. 3A and 3B. Substrate structure 300, containing a $Zn_{1-x}Mg_xO$ window layer, may be manufactured by one or more processes, wherein one or more layers of the structure may be manufactured by one or more of sputtering, evaporation deposition, and chemical vapor deposition (CVD). Similarly, the $Zn_{1-x}Mg_xO$ window layer of photovoltaic device 300 may be manufactured by one or more the following processes, including sputtering, evaporation deposition, CVD, chemical bath deposition and vapor transport deposition.

In one embodiment, a process for manufacturing a photovoltaic device may include a sputtering process of a $Zn_{1-x}Mg_xO$ window layer by one of DC Pulsed sputtering, RF sputtering, AC sputtering, and other manufacturing processes in general. The source materials used for sputtering can be one or more ceramic targets of a $Zn_{1-x}Mg_xO$ ternary compound, where x is in the range of 0 to 1. In one embodiment, source materials used for sputtering can be one or more targets of $Zn_{1-x}Mg_x$ alloy, where x is in the range of 0 to 1. In another embodiment, source materials used for sputtering can be two or more ceramic targets with one or more made from ZnO and the one or more made from MgO. In another embodiment, source materials used for sputtering can be two or more metal targets with one or more made from Zn and one or more made from Mg. Process gas for sputtering the $Zn_{1-x}Mg_xO$ can be a mixture of argon and oxygen using different mixing ratios.

In one embodiment, a $Zn_{1-x}Mg_xO$ window layer can be deposited by atmospheric pressure chemical vapor deposition (APCVD) with precursors including but not limited to diethyl zinc, bis(cyclopentadienyl)magnesium with reagent such as $H_2O$ or ozone.

According to another embodiment, the process for manufacturing a photovoltaic device may result in a conduction band offset with respect to an absorber layer. For example, the conduction band offset of a window ($Zn_{1-x}Mg_xO$) layer with respect to the absorber layer can be adjusted between 0 and +0.4 eV by choosing the proper value of x. Further, the conductivity of a $Zn_{1-x}Mg_xO$ window layer can be adjusted within a range of 1 mOhm per cm to 10 Ohm per cm by doping the zinc magnesium oxide with one of aluminum (Al), manganese (Mn), niobium (Nb), nitrogen (N), fluorine (F), and by introduction of oxygen vacancies. In one embodiment the dopant concentration is from about $1 \times 10^{14}$ cm$^{-3}$ to about $1 \times 10^{19}$ cm$^{-3}$. In one embodiment, the window layer is formed using a sputter target having a dopant concentration from about $1 \times 10^{17}$ cm$^{-3}$ to about $1 \times 10^{18}$ cm$^{-3}$.

What is claimed is:

1. A photovoltaic device comprising:
   a glass substrate;
   a barrier layer over the substrate;
   a transparent conductive oxide layer over the barrier layer;
   a buffer layer over the transparent conductive oxide layer;
   a first semiconductor window layer over the buffer layer, the first semiconductor window layer comprising $Zn_{1-x}Mg_xO$, wherein 0<x<1;
   a second semiconductor window layer comprising cadmium sulfide over the first semiconductor window layer; and
   a cadmium telluride semiconductor absorber layer over the second semiconductor window layer;
   wherein the conduction band offset of the first semiconductor window layer with respect to the cadmium telluride semiconductor absorber layer is in the range of 0 to +0.4 eV.

2. The photovoltaic device of claim 1, wherein the first semiconductor window layer is on the buffer layer.

3. The photovoltaic device of claim 1, wherein the thickness of the first semiconductor window layer ranges from about 2 nm to about 2000 nm.

4. The photovoltaic device of claim 2, wherein the conductivity of the first semiconductor window layer is within a range of about 1 mOhm per cm to about 10 Ohm per cm.

5. The photovoltaic device of claim 2, wherein the first semiconductor window layer is doped with Al, Mn, Nb, N, F or by introducing oxygen vacancies.

6. The photovoltaic device of claim 2, wherein:
   the barrier layer is between the glass substrate and the transparent conductive oxide layer.

7. The photovoltaic device of claim 1, wherein the first semiconductor window layer is doped with Al, Mn, Nb, N, F or by introducing oxygen vacancies.

8. The photovoltaic device of claim 1, wherein the first semiconductor window layer has a dopant concentration of between about $1 \times 10^{14}$ cm$^{-3}$ and about $1 \times 10^{19}$ cm$^{-3}$.

9. The photovoltaic device of claim 8, wherein the first semiconductor window layer has a dopant concentration of between about $1 \times 10^{17}$ cm$^{-3}$ and about $1 \times 10^{18}$ cm$^{-3}$.

* * * * *